(12) United States Patent
Lu et al.

(10) Patent No.: US 9,960,281 B2
(45) Date of Patent: May 1, 2018

(54) METAL OXIDE THIN FILM TRANSISTOR WITH SOURCE AND DRAIN REGIONS DOPED AT ROOM TEMPERATURE

(71) Applicant: The Hong Kong University of Science and Technology, Hong Kong (CN)

(72) Inventors: Lei Lu, Kowloon (HK); Man Wong, New Territories (HK); Hoi Sing Kwok, Kowloon (HK)

(73) Assignee: THE HONG KONG UNIVERSITY OF SCIENCE AND TECHNOLOGY, Kowloon (HK)

( * ) Notice: Subject to any disclaimer, the term of this patent is extended or adjusted under 35 U.S.C. 154(b) by 40 days.

(21) Appl. No.: 14/617,181

(22) Filed: Feb. 9, 2015

(65) Prior Publication Data

US 2016/0233338 A1 Aug. 11, 2016

(51) Int. Cl.
*H01L 29/786* (2006.01)
*H01L 21/426* (2006.01)
(Continued)

(52) U.S. Cl.
CPC ........ *H01L 29/7869* (2013.01); *H01L 21/426* (2013.01); *H01L 27/1218* (2013.01);
(Continued)

(58) Field of Classification Search
CPC . H01L 29/7869; H01L 29/1033; H01L 29/24; H01L 29/66969; H01L 29/78603;
(Continued)

(56) References Cited

U.S. PATENT DOCUMENTS 4,683,645 A 8/1987 Naguib et al.
2007/0236141 A1* 10/2007 Lee ..................... H01L 27/1214
313/506
(Continued)

FOREIGN PATENT DOCUMENTS

CN 101964375 2/2011
CN 102420289 4/2012
(Continued)

OTHER PUBLICATIONS

Z. Ye and M. Wong, "A study on the hysteresis in zinc oxide thin-film transistor with deposited silicon dioxide as the gate dielectric," ICSICT, 2012.
(Continued)

*Primary Examiner* — Cheung Lee
*Assistant Examiner* — Stephen C Smith
(74) *Attorney, Agent, or Firm* — Amin, Turocy & Watson, LLP

(57) ABSTRACT

Thin film transistors are provided that include a metal oxide active layer with source and drain regions having a reduced resistivity relative to the metal oxide based on doping of the source and drain regions at room temperature. In an aspect, a transistor structure is provided, that includes a substrate, and source and drain regions within a doped active layer having resulted from doping of an active layer comprising metal-oxide and formed on the substrate, wherein the doped active layer was doped at room temperature and without thermal annealing, thereby resulting in a reduction of a resistivity of the source and drain regions of the doped active layer relative to the active layer prior to the doping. In an aspect, the source and drain regions have a resistivity of about 10.0 mΩ·cm after being doped with stable ions and without subsequent activation of the ions via annealing.

20 Claims, 10 Drawing Sheets

(51) Int. Cl.
*H01L 27/12* (2006.01)
*H01L 29/66* (2006.01)
*H01L 29/24* (2006.01)
*H01L 29/10* (2006.01)

(52) U.S. Cl.
CPC ...... *H01L 27/1225* (2013.01); *H01L 29/1033* (2013.01); *H01L 29/24* (2013.01); *H01L 29/66969* (2013.01); *H01L 29/78603* (2013.01)

(58) Field of Classification Search
CPC ............... H01L 27/1218; H01L 27/1225; H01L 21/426
See application file for complete search history.

(56) References Cited

U.S. PATENT DOCUMENTS

| | | | | |
|---|---|---|---|---|
| 2008/0296567 | A1* | 12/2008 | Irving | H01L 21/02554 257/43 |
| 2009/0289333 | A1* | 11/2009 | Lujan | H01L 27/1218 257/640 |
| 2012/0161124 | A1* | 6/2012 | Yamazaki | H01L 21/02554 257/43 |
| 2013/0181214 | A1* | 7/2013 | Yamazaki | H01L 29/7869 257/43 |
| 2013/0298987 | A1 | 11/2013 | Losio et al. | |
| 2015/0221775 | A1* | 8/2015 | Yamazaki | H01L 29/7869 257/43 |

FOREIGN PATENT DOCUMENTS

| | | |
|---|---|---|
| CN | 102864578 | 1/2013 |
| CN | 103199094 | 7/2013 |
| CN | 103730510 | 4/2014 |
| CN | 103866264 | 6/2014 |
| JP | 58108774 | 6/1983 |
| KR | 100847846 | 7/2008 |
| TW | 201404909 | 2/2001 |

OTHER PUBLICATIONS

M. Fakhri, H. Johann, P. Görrn and T. Riedl, "Water as origin of hysteresis in zinc tin oxide thin-film transistors," ACS Appl. Mater. Interfaces, vol. 4, No. 9, pp. 4453-4456, Sep. 2012.

K. Remashan, D.-K. Hwang, S.-J. Park, and J.-H. Jang, "Impact of hydrogenation of ZnO TFTs by plasma-deposited silicon nitride gate," IEEE Trans. Electron Devices, vol. 55, No. 10, pp. 2736-2743, Oct. 2008.

K. Nomura, T. Kamiya, H. Ohta, M. Hirano and H. Hosono, "Defect passivation and homogenization of amorphous oxide thin-film transistor by wet O2 annealing," Appl. Phys. Lett., vol. 93, No. 19, pp. 192107,2008.

P. F. Carcia, R. S. McLean, M. H. Reilly and G. Nunes Jr., "Transparent ZnO thin-film transistor fabricated by rf magnetron sputtering," Appl. Phys. Lett., vol. 82, No. 7, pp. 1117-1119, Feb. 2003.

S. Bang, S. Lee, J. Park, S. Park, W. Jeong, and H. Jeon, "Investigation of the effects of interface carrier concentration on ZnO thin film transistors fabricated by atomic layer deposition," J. Phys. D. Appl. Phys., vol. 42, No. 23, pp. 235102, Nov. 2009.

A. Janotti and C. G. Van de Walle, "Fundamentals of zinc oxide as a semiconductor," Rep. Progr. Phys., vol. 72, No. 12, p. 126501, Dec. 2009.

S. J. Pearton, D. P. Norton, K. Ip, Y. W. Heo, and T. Steiner, "Recent advances in processing of ZnO," J. Vac. Sci. Technol. B, Microelectron Nanometer Struct., vol. 22, No. 3, pp. 932-948, 2004.

J. S. Park, W.-J. Maeng, H.-S. Kim, and J.-S. Park, "Review of recent developments in amorphous oxide semiconductor thin-film transistor devices," Thin Solid Films, vol. 520, No. 6, pp. 1679-1693, Jan. 2012.

R. J. Lad, "Postdeposition annealing behavior of RF sputtered ZnO films," J. Vac. Sci. Technol., vol. 17, No. 4, pp. 808-811, Jul. 1980.

D. K. Lee, S. Kim, M. C. Kim, S. H. Eom, H. T. Oh, and S.-H. Choi, "Annealing effect on the electrical and the optical characteristics of undoped ZnO thin films grown on characteristics of undoped ZnO thin films Si substrates by RF magnetron sputtering sputtering," J. Korean Phys. Soc., vol. 51, No. 4, pp. 1378-1382, 2007.

K. Ogata, K. Sakurai, S. Fujita, S. Fujita, and K. Matsushige, "Effects of thermal annealing of ZnO layers grown by MBE," J. Cryst. Growth, vol. 215, pp. 312-315, Jun. 2000.

L. Ke, S. C. Lai, J. D. Ye, V. L. Kaixin, and S. J. Chua, "Point defects analysis of zinc oxide thin films annealed at different temperatures with photoluminescence, Hall mobility, and low frequency noise," J. Appl. Phys., vol. 108, No. 8, pp. 084502-1-084502-6, 2010.

H. S. Kang, "Annealing effect on the property of ultraviolet and green emissions of ZnO thin films," J. Appl. Phys., vol. 95, No. 3, pp. 1246-1250, 2004.

W. S. Shi, O. Agyeman, and C. N. Xu, "Enhancement of the light emissions from zinc oxide films by controlling the post-treatment ambient," J. Appl. Phys., vol. 91, No. 9, pp. 5640-5644, 2002.

X. Q. Wei, B. Y. Man, M. Liu, C. S. Xue, H. Z. Zhuang, and C. Yang, "Blue luminescent centers and microstructural evaluation by XPS and Raman in ZnO thin films annealed in vacuum, N2 and O2," Phys. B, Condensed Matter, vol. 388, Nos. 1-2, pp. 145-152, Jan. 2007.

S. T. Meyers, J. T. Anderson, C. M. Hung, J. Thompson, J. F. Wager, and D. A. Keszler, "Aqueous inorganic inks for low-temperature fabrication of ZnO TFTs," J. Amer. Chem. Soc., vol. 130, No. 51, pp. 17603-17609, Dec. 2008.

B. S. Ong, C. Li, Y. Li, Y. Wu, and R. Loutfy, "Stable, solution-processed, high-mobility ZnO thin-film transistors," J. Amer. Chem. Soc., vol. 129, No. 10, pp. 2750-2751, Mar. 2007.

L. J. Brillson and Y. Lu, "ZnO Schottky barriers and Ohmic contacts," J. Appl. Phys., vol. 109, No. 12, pp. 121301-1-121301-33, 2011.

Chen, et al. "Annealing process of ion-implantation-induced defects in ZnO: Chemical effect of the ion species," J. Appl. Phys., vol. 99, No. 9, p. 093507, 2006.

Kohiki, et al. "Enhanced electrical conductivity of zinc oxide thin films by ion implantation of gallium, aluminum, and boron atoms," J. Appl. Phys., vol. 75, No. 4, p. 2069, 1994.

Ye, et al. "Investigation of phosphorus and arsenic as dopants in polycrystalline thin films of zinc oxide," J. Appl. Phys., vol. 113, No. 2, p. 024506, 2013.

Ye, et al. "Zinc-Oxide Thin-Film Transistor With Self-Aligned Source/Drain Regions Doped With Implanted Boron for Enhanced Thermal Stability," IEEE Trans. Electron Devices, vol. 59, No. 2, pp. 393-399, Feb. 2012.

Chen, et al. "Self-Aligned Indium-Gallium-Zinc Oxide Thin-Film Transistor With Phosphorus-Doped Source/Drain Regions," IEEE Electron Device Lett., vol. 33, No. 8, pp. 1150-1152, Aug. 2012.

E. Fortunato, P. Barquinha and R. Martins, "Oxide semiconductor thin-film transistors: a review of recent advances," Adv. Mater., vol. 24, No. 22, pp. 2945-2986, Jun. 2012.

L. J. Brillson and Y. Lu, "ZnO Schottky barriers and Ohmic contacts," J. Appl. Phys., vol. 109, No. 12, pp. 121301, Jun. 2011.

L. Lu and M. Wong, "The resistivity of zinc oxide under different annealing configurations and its impact on the leakage characteristics of zinc oxide thin-film transistors," IEEE Trans. Electron Devices, vol. 61, No. 4, pp. 1077-1084, Apr. 2014.

T. Hirao, M. Furuta, H. Furuta, T. Matsuda, T. Hiramatsu, H. Hokari, M. Yoshida, H. Ishii and M. Kakegawa, "Novel top-gate zinc oxide thin-film transistors (ZnO TFTs) for AMLCDs," J. Soc. Inf. Disp., vol. 15, No. 1, pp. 17-22, 2007.

T. Hirao, M. Furuta, T. Hiramatsu, T. Matsuda, C. Li, H. Furuta, H. Hokari, M. Yoshida, H. Ishii, and M. Kakegawa, "Bottom-gate zinc oxide thin-film transistors (ZnO TFTs) for AM-LCDs," IEEE Trans. Electron Devices, vol. 55, No. 11, pp. 3136-3142, Nov. 2008.

Z. Ye and M. Wong, "Characteristics of thin-film transistors fabricated on fluorinated zinc oxide," IEEE Electron Device Lett., vol. 33, No. 4, pp. 549-551, Apr. 2012.

(56) References Cited

OTHER PUBLICATIONS

Z. Ye and M. Wong, "Investigation of phosphorus and arsenic as dopants in polycrystalline thin films of zinc oxide," J. Appl. Phys., vol. 13, No. 2, pp. 024506-1-024506-6, 2013.

G. Z. Xing, B. Yao, C. X. Cong, T. Yang, Y. P. Xie, B. H. Li, et al., "Effect of annealing on conductivity behavior of undoped zinc oxide prepared by RF magnetron sputtering," J. Alloys Compounds, vol. 457, Nos. 1-2, pp. 36-41, Jun. 2008.

D. Look, G. Farlow, P. Reunchan, S. Limpijumnong, S. Zhang, and K. Nordlund, "Evidence for native-defect donors in n-type ZnO," Phys. Rev. Lett., vol. 95, No. 22, pp. 1-4, Nov. 2005.

F. Selim, M. Weber, D. Solodovnikov, and K. Lynn, "Nature of native defects in ZnO," Phys. Rev. Lett., vol. 99, No. 8, pp. 085502-1-85502-4, Aug. 2007.

D. C. Look and J. W. Hemsky, "Residual native shallow donor in ZnO," Phys. Rev. Lett., vol. 82, No. 12, pp. 2552-2555, 1999.

S.-H. Jeong, B.-S. Kim, and B.-T. Lee, "Photoluminescence dependence of ZnO films grown on Si(100) by radio-frequency magnetron sputtering on the growth ambient," Appl. Phys. Lett., vol. 82, No. 16, p. 2625, 2003.

B. Lin, Z. Fu, and Y. Jia, "Green luminescent center in undoped zinc oxide films deposited on silicon substrates," Appl. Phys. Lett., vol. 79, No. 7, pp. 943-945, 2001.

C. Wu, H. Hsieh, C. Chien, and C. Wu, "Self-aligned top-gate coplanar In—Ga—Zn—O Thin-Film Transistors," J. Display Technol., vol. 5, No. 12, pp. 515-519, 2009.

D. H. Kang, I. Kang, S. H. Ryu, and J. Jang, "Self-aligned coplanar a-IGZO TFTs and application to high-speed circuits," IEEE Electron Device Lett., vol. 32, No. 10, pp. 1385-1387, Oct. 2011.

P, Xu, et al. "Ulta-shallow junctions formed using microwave annealing", Applied Physics Letters, 102, 122114 (2013).

H. Hosono, "Ionic amorphous oxide semiconductors: Materials design, carrier transport, and device application", Journal of Non-Crystalline Solids, vol. 352, Iss. 9-20, Jun. 15, 2006, pp. 851-858.

S. Kim, et al. "Source/Drain Formation of Self-Aligned Top-Gate Amorphous GaInZnO Thin-Film Transistors by Plasma Treatment", IEEE Electron Device Lett., vol. 30, No. 4, pp. 374-376, Feb. 2009.

\* cited by examiner

METAL OXIDE THIN FILM TRANSISTOR WITH SOURCE AND DRAIN REGIONS DOPED AT ROOM TEMPERATURE

TECHNICAL FIELD

This disclosure relates generally to thin film transistors that include a metal oxide active layer with source and drain regions having a reduced resistivity relative to the metal oxide based on doping of the source and drain regions at room temperature.

BACKGROUND

A thin-film transistor (TFT) consists of a channel region located between source and drain (S/D) regions. The resistance of the channel is modulated by the voltage on the gate electrode, while that of the S/D regions is not. For a conventional metal-oxide (MO)TFT, metal is used to contact the S/D regions, forming Schottky barriers at the junction where the metal contacts the metal oxide in the S/D regions. The resistance associated with such a junction is high, resulting in lowering of the on-state current. Accordingly mechanisms to reduce the resistance of the S/D regions are desired.

In some aspects, high resistance associated with the Schottky barrier can be reduced if the resistivity of the metal oxide region under the metal coverage is decreased. Existing techniques for decreasing the resistivity of the S/D regions incorporate extrinsic dopants into the metal oxide of the S/D, conventionally including two steps. The dopants are first injected into the S/D regions and then activated by the heat-treatments to supply carriers. However, the activation annealing step not only reduces the S/D resistivity but also potentially generates defects in the channel and drives dopants to diffuse into the channel, shortening the effective channel length and possibly degrading the transistor characteristics.

The above-described deficiencies of conventional MOTFT devices are merely intended to provide an overview of some context relating to current technology, and are not intended to be exhaustive. Other information about the state of the art may become further apparent upon review of the following detailed description.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

Figure 1:
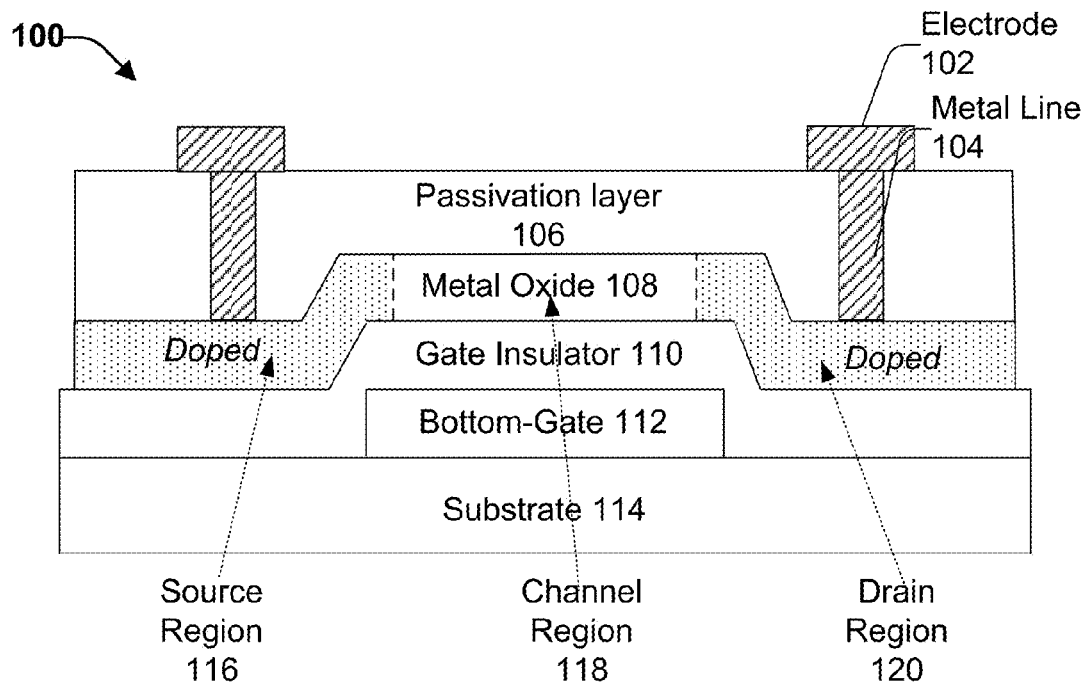
FIG. 1 presents a cross-sectional view of a bottom gate TFT that includes a metal oxide active layer with S/D regions having a reduced resistivity relative to the metal oxide based on doping of the S/D regions without thermal annealing, in accordance with aspects and embodiments described herein.

Various aspects or features of this disclosure are described with reference to the drawings, wherein like reference numerals are used to refer to like elements throughout. In this specification, numerous specific details are set forth in order to provide a thorough understanding of the subject disclosure. It should be understood, however, that the certain aspects of this disclosure may be practiced without these specific details, or with other methods, components, materials, etc. In other instances, well-known structures and devices are shown in block diagram form to facilitate describing the subject disclosure.

By way of introduction, the subject matter disclosed herein relates to techniques to effectively dope the S/D regions of a MOTFT without the need of activation annealing by fabricating the MOTFT with room-temperature doped S/D regions. As a result, the activation induced defect wherein dopants laterally diffuse from the S/D regions into the channel region is avoided, enhancing the transistor performance. For example, without the lateral diffusion of dopants from S/D regions into channel caused by activation annealing, the overlap region between the gate electrode and the S/D can be minimized, notably reducing the parasitic capacitance and thus offering a higher device switching speed. In addition, the channel length can be shorted because the extra channel length included in conventional MOTFTs to compensate for the dopant diffusion is not needed, allowing for the fabrication of MOTFTs with ultra-short channels (e.g., approximately less than 100 nm) and improving the scalability of the MOTFT. The elimination of the heat-treatment step also lowers transistor manufacturing cost.

Further, the subject room-temperature doping technique significantly lowers the process temperature for the MOTFT with S/D regions having a reduced resistivity based on doping. As a result the subject MOTFT can be formed using a heat sensitive substrate that cannot otherwise withstand the high temperatures associated with post ion implantation annealing, including a flexible substrate formed with polymer, thus enabling its application on flexible displays.

In an aspect a transistor structure is provided, that includes a substrate, and source and drain regions within a doped active layer having resulted from doping of an active layer comprising metal-oxide and formed on the substrate, wherein the doped active layer was doped without thermal annealing (e.g., a temperature between about 20° C. and 26° C.), thereby resulting in a reduction of a resistivity of the source and drain regions of the doped active layer relative to the active layer prior to the doping. In an aspect, the source and drain regions have a resistivity of about 10 mΩ·cm after being doped a high concentration of stable ions and without subsequent activation of the ions via annealing. For example, when the metal oxide layer is formed with zinc oxide (ZnO), the implantation of both phosphorus and silicon into ZnO at room temperature and without thermal annealing at a concentration of about $10^{21} cm^{-3}$ can effectively reduce the ρ of ZnO to near or below 10 mΩ·cm.

In another aspect, a device is disclosed that includes a flexible display and a transistor configured to facilitate operation of the flexible display. The transistor includes a flexible substrate, source and drain regions within a doped active layer having resulted from doping of an active layer comprising metal-oxide and formed on the substrate, a channel region within the doped active layer between the source and drain regions, wherein homojunctions are formed between the source and drain regions and the channel region. The transistor further includes a gate stack formed on the doped active layer adjacent to the channel region, the gate stack comprising a gate insulator and a gate electrode, wherein the doping resulting in the doped active layer was performed at a temperature between about 20° C. and 26° C. and without subsequent annealing of the doped active layer, thereby resulting in establishment of the source and drain regions exhibiting a resistivity of less than or equal to about 11 mΩ·cm.

In yet another aspect, a method for fabricating a MOTFT transistor is provided that includes disclosed that includes forming an active layer comprising metal-oxide on a substrate, forming an insulation layer on the active layer, forming a gate electrode on the insulation layer; doping the active layer at a temperature between about 20° C. and 26° C., using the gate electrode as a mask, forming self-aligned source and drain regions within the active layer having a first resistivity based on the doping that is lower than a second resistivity of the metal-oxide, and removing a portion of the insulation layer formed on and adjacent to the source and drain regions via etching.

Figure 2:
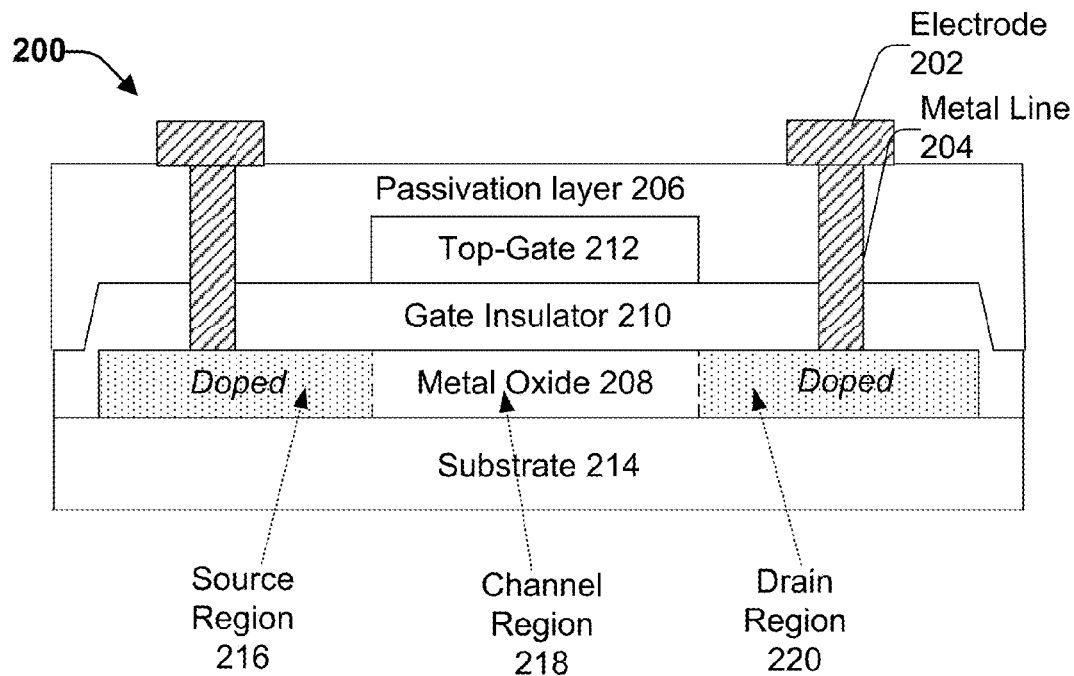
FIG. 2 presents a cross-sectional view of a top gate TFT that includes a metal oxide active layer with S/D regions having a reduced resistivity relative to the metal oxide based on doping of the S/D regions without thermal annealing, in accordance with aspects and embodiments described herein.

With reference to FIG. 1 and FIG. 2 presented area cross-sectional views of TFTs that include a metal oxide active layer with S/D regions having a reduced resistivity relative to the metal oxide based on doping of the S/D regions without thermal annealing, in accordance with aspects and embodiments described herein. FIG. 1 presents a bottom gate TFT 100 and FIG. 2 presents a top gate TFT 100. Repetitive description of like elements employed in respective embodiments of TFT devices described herein is omitted for sake of brevity.

Both the bottom gate TFT 100 and the top gate TFT 200 can include a substrate, 114 and 214 respectively, a gate insulator layer, 110 and 210 respectively, and an active metal oxide layer, 108 and 208, respectively. The active metal oxide layers 108 and 208 respectively include doped S/D regions (e.g., source region 116 and drain region 120 for bottom gate TFT 100, and source region 216 and drain region 218 for the top gate TFT 200). The doped S/D regions are respectively separated by a channel region located within the metal oxide layers 108 and 208, respectively (e.g., channel region 118 for the bottom gate TFT 100 and channel region 218 for the top gate TFT 200). Both the bottom gate TFT 100 and the top gate TFT 200 can further include a passivation layer, 106 and 206 respectively, S/D electrodes, 102 and 202 respectively, and metal lines 104 and 204, respectively connecting the S/D electrodes to the S/D regions (e.g., S/D regions 116/120 and S/D regions 216/220.

The structure of the bottom gate TFT 100 includes a bottom gate electrode 112 formed on and adjacent to the substrate 114. The gate insulator layer 110 is formed on and adjacent to the bottom gate 112. The bottom gate electrode 112 and the gate insulator layer 110 together form what is referred to herein as the gate stack. The active metal oxide layer 108 of the bottom gate TFT is formed on and adjacent to the gate insulator layer 110 and the passivation layer 106 is formed on and adjacent to the metal oxide layer 108. The doped S/D regions 116/120 of the bottom gate TFT are located within the active metal oxide layer 108 on opposite sides of the bottom gate electrode 112 and separated by a non-doped channel region 118 located within the metal oxide layer 108.

The structure of the top gate TFT 200 includes the active metal oxide layer 208 formed on an adjacent to the substrate 214. The gate insulator layer 210 is formed on and adjacent to the active metal oxide layer 208 a top gate electrode 212 is formed on and adjacent to the gate insulator layer 210. The passivation layer 206 is formed on an adjacent to the top gate electrode 212 and portion of the gate insulator layer 206. The doped S/D regions 216/220 of the top gate TFT are located within the active metal oxide layer 208 on opposite sides of the top gate electrode 212 and separated by a non-doped channel region 218 located within the active metal oxide layer 208.

The S/D regions of the bottom gate TFT 100 and the top gate TFT 200 are doped (as indicated by the portions of the metal oxide layers 108 and 208 respectively filled with a dotted pattern). The doped S/D regions of the metal oxide active layers 108 and 208 respectively have a reduced resistivity relative to the metal oxide active layer prior to the doping. The channel regions 118 and 218 retain the resistivity of the native non-doped metal oxide material. Thus the channel regions have a higher resistivity than then S/D regions, establishing homojunctions at the channel/source interfaces and the channel/drain interfaces (indicated by the dashed lines).

The material for the active metal oxide layers 108 and 208 of both the bottom gate TFT and the top gate TFT is selected to have a resistivity (ρ) below a maximum ρ when doped with a sufficient concentration of stable ions at room temperature (e.g., wherein room temperature is generally between about 20° C. and 26° C.) and without thermal annealing. In an aspect, the S/D regions have a resistivity less than or equal to about 100 mΩ·cm after being doped with a high concentration of stable ions and without subsequent activation of the ions via annealing. In another aspect, the S/D regions have a resistivity less than or equal to about 50 mΩ·cm after being doped with a high concentration of stable ions and without subsequent activation of the ions via annealing. In yet another aspect, the S/D regions have a resistivity of less than or equal to about 25 mΩ·cm after being doped with a high concentration of stable ions and without subsequent activation of the ions via annealing. Still in yet another aspect, the S/D regions have a resistivity less than or equal to about 10 mΩ·cm after being doped with a high concentration of stable ions and without subsequent activation of the ions via annealing.

For example, when the metal oxide layer is formed with zinc oxide (ZnO), the implantation of both phosphorus and silicon into ZnO at room temperature and without thermal annealing at a concentration of about $10^{21}$ cm$^{-3}$ can effectively reduce the ρ of the ZnO to near or below 10 mΩ·cm, a resistivity reduction of about 6 orders. Thus in an aspect, the metal oxide layers 108 and 208 respectively include ZnO. In another aspect, the metal oxide layer 108 and 208 respectively include IGZO. Other suitable metal oxides that can be employed for the active metal oxide layers 108 and 208, respectively, can include but are not limited to: zinc oxynitride, indium-gallium-zinc oxide, zinc-tin oxide, tin oxide, indium oxide, copper oxide, uranium oxide, bismuth oxide, barium titanate, strontium titanate, and lithium niobate.

In an aspect, the S/D regions 116/120 and 216/220 are respectively doped with stable ions at a concentration greater than or equal to about $10^{19}$ cm$^{-3}$. In another aspect, the S/D regions 116/120 and 216/220 are respectively doped with stable ions at a concentration greater than or equal to about $10^{20}$ cm$^{-3}$. In another aspect, the S/D regions 116/120 and 216/220 are respectively doped with stable ions at a concentration greater than or equal to about $10^{21}$ cm$^{-3}$. Still in yet another aspect, the S/D regions 116/120 and 216/220 are respectively doped with stable ions at a concentration greater than or equal to about $10^{22}$ cm$^{-3}$. The ions or dopants doped or implanted into the S/D regions 116/120 and 216/220 can vary. In an exemplary embodiment, the ions/dopants include phosphorus and/or silicon. However, other suitable ions can include but are not limited to, arsenic and/or boron.

Figure 3:
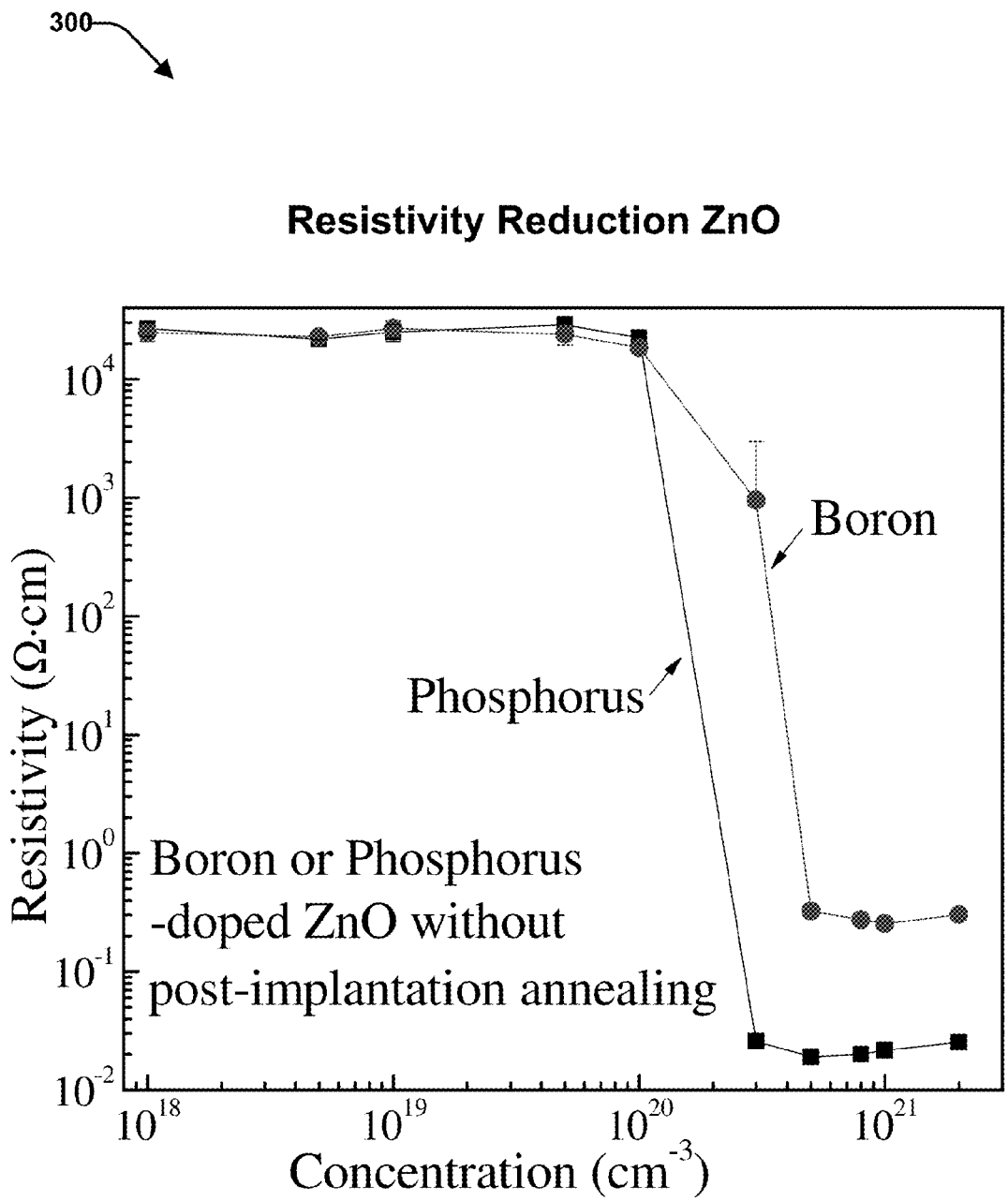
FIG. 3 provides a graph demonstrating the dependence of the resistivity of zinc oxide (ZnO) when doped without thermal annealing with boron or phosphorus ions in accordance with various aspects and embodiments described herein.

For example, FIG. 3 presents a graph demonstrating the dependence of the resistivity of zinc oxide (ZnO) when doped at room temperature with boron or phosphorus ions in accordance with various aspects and embodiments described herein. As seen in FIG. 3, the resistivity of ZnO sharply decreases when the concentration of implanted boron or phosphorus increases above $10^{20}$ cm$^{-3}$ with the resistivity being lower for ZnO doped with phosphorus than with boron. In particular, when doped with boron at a concentration of about $10^{21}$ cm$^{-3}$, the resistivity of ZnO is between about $10^{0}$ Ω·cm and $10^{-1}$ Ω·cm, and when doped with phosphorus at a concentration of about $10^{21}$ cm$^{-3}$ the resistivity of ZnO is between about $10^{-1}$ Ω·cm and $10^{-2}$ Ω·cm.

With reference back to FIGS. 1 and 2, in an exemplary embodiment, the S/D regions 116/120 and 216/220 include ZnO doped with phosphorus at a concentration greater than or equal to about $10^{21}$ cm$^{-3}$, wherein the doping was performed at a temperature less than at least 300° C., preferably less than 150° C., more preferably at a temperature less than 75° C., and even more preferably at a temperature between about 20° C. and 26° C. (e.g., room temperature). In accordance with this embodiment, based on the combination of the dopants employed (phosphorus), the concentration of the dopants (e.g., about $10^{21}$ cm$^{-3}$), the metal oxide employed (ZnO) and the temperature at which the metal oxide was doped (e.g., about room temperature), the S/D regions 116/120 and 216/220 have a ρ of about 11.0 mΩ·cm, a resistivity reduction of about 6 orders relative to the resistivity of the non-doped portion of the metal oxide layers 108 and 208 forming the channel regions 118 and 218, respectively. Notably, this reduction in resistivity is achieved without activation of the doped ions via a heat treatment (e.g., post implantation annealing or doping with the thermal diffusion of the dopants in a furnace).

In another embodiment, the S/D regions 116/120 and 216/220 include ZnO doped with silicon at a concentration greater than or equal to about $10^{21}$ cm$^{-3}$, wherein the doping was performed at a temperature less than at least 300° C., preferably less than 150° C., more preferably at a temperature less than 75° C., and even more preferably at a temperature between about 20° C. and 26° C. (e.g., room temperature). In accordance with this embodiment, based on the combination of the dopants employed (silicon), the concentration of the dopants (e.g., about $10^{21}$ cm$^{-3}$), the metal oxide employed (ZnO) and the temperature at which the metal oxide was doped (e.g., about room temperature), the S/D regions 116/120 and 216/220 have a ρ of about 5.8 mΩ·cm, a resistivity reduction of about 6 orders relative to the resistivity of the non-doped portion of the metal oxide layers 108 and 208 forming the channel regions 118 and 218, respectively. Notably, this reduction in resistivity is achieved without activation of the doped ions via a heat treatment (e.g., post doping annealing or implantation with the thermal diffusion of the dopants in a furnace).

In another embodiment, the S/D regions 116/120 and 216/220 include ZnO doped with boron at a concentration greater than or equal to about $10^{21}$ cm$^{-3}$, wherein the doping was performed at a temperature less than at least 300° C., preferably less than 150° C., more preferably at a temperature less than 75° C., and even more preferably at a temperature between about 20° C. and 26° C. (e.g., room temperature). In accordance with this embodiment, based on the combination of the dopants employed (boron), the concentration of the dopants (e.g., about $10^{21}$ cm$^{-3}$), the metal oxide employed (ZnO) and the temperature at which the metal oxide was doped (e.g., about room temperature), the S/D regions 116/120 and 216/220 have a ρ of about 100 mΩ·cm, a resistivity reduction of about 5 orders relative to the resistivity of the non-doped portion of the metal oxide layers 108 and 208 forming the channel regions 118 and 218, respectively. Notably, this reduction in resistivity is achieved without activation of the doped ions via a heat treatment (e.g., post implantation annealing or doping with the thermal diffusion of the dopants in a furnace).

Because the resistivity of the S/D regions 116/120 and 216/220 can be effectively reduced by doping at room temperature (or temperatures at least below 300° C.), the activation induced defect wherein dopants laterally diffuse from the S/D regions into the channel region is avoided, enhancing the transistor performance. For example, without the lateral diffusion of dopants from S/D regions into channel caused by activation annealing, the overlap region between the gate electrode and the S/D can be minimized, notably reducing the parasitic capacitance and thus offering a higher device switching speed.

Figure 4:
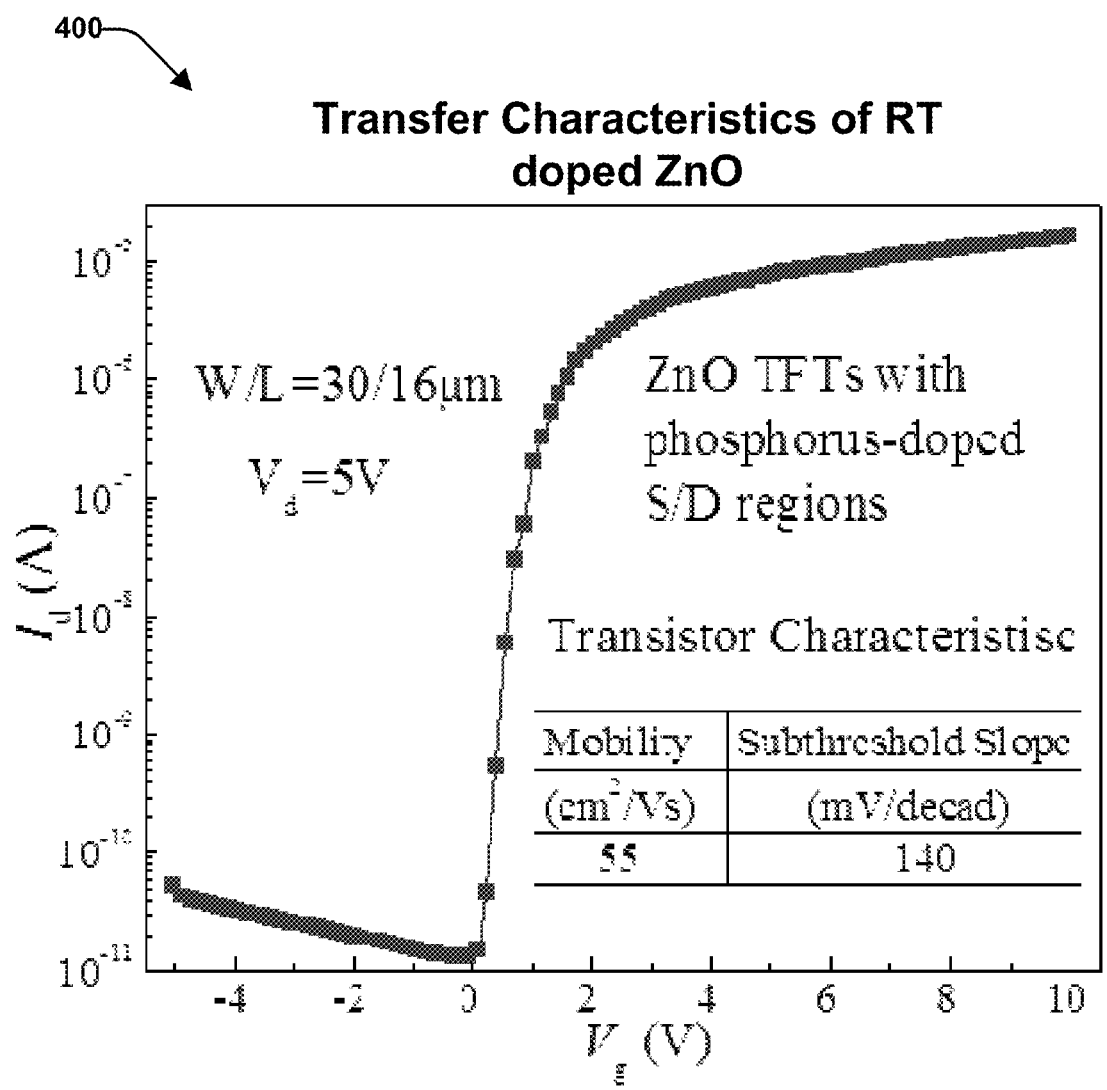
FIG. 4 provides a graph demonstrating the transfer characteristics of ZnO when doped without thermal annealing with phosphorus ions in accordance with various aspects and embodiments described herein.

For example, FIG. 4 presents a graph demonstrating the transfer characteristics of TFT device 100 or 200 when ZnO is employed as the active layer and when doped at room temperature and without thermal annealing with phosphorus ions at a concentration of about $10^{21}$ cm$^{-3}$ in accordance with various aspects and embodiments described herein. The transfer curve demonstrates that the subject devices exhibit a high mobility and steep subthreshold slope. The ZnO TFT was fabricated according to the process flow described in FIGS. 10-14. The 100 nm ZnO active layer was sputtered on a glass substrate in a 13.56 MHz radio frequency magnetron sputtering machine with an ambience of 10% oxygen ($O_2$) and 90% argon (Ar). The 100 nm gate dielectric, made of silicon oxide, was deposited in a plasma-enhanced chemical vapor deposition reactor. The gate electrode of 200 nm indium-tin oxide was also sputtered. With the gate electrode as the implantation mask, the $10^{21}$ $cm^{-3}$ phosphorus was implanted in the source and drain regions, reducing the resistivity of ZnO to about 10 mΩ·cm.

In addition, the channel length can be shorted because the extra channel length included in conventional MOTFTs to compensate for the dopant diffusion is not needed, allowing for the fabrication of MOTFTs with ultra-short channels and improving the scalability of the MOTFT. In an aspect, the channel regions 118 and 218 respectively, have a length spanning from the channel/source junction to the channel/drain junction (represented by the dashed lines) of approximately 1000 nm. In another aspect, the channel regions 118 and 218 respectively, have a length spanning from the channel/source junction to the channel/drain junction of less than 1000 nm. In another aspect, the channel regions 118 and 218 respectively, have a length spanning from the channel/source junction to the channel/drain junction of less than or equal to approximately 500 nm. Still in yet another aspect, the channel regions 118 and 218 respectively, have a length spanning from the channel/source junction to the channel/drain junction of less than or equal to approximately 100 nm. Still in yet another aspect, the channel regions 118 and 218 respectively, have a length spanning from the channel/source junction to the channel/drain junction of less than or equal to approximately 50 nm.

Further, the subject room-temperature doping technique significantly lowers the process temperature for the MOTFT with S/D regions having a reduced resistivity based on doping. As a result the subject MOTFTs 100 and 200 can be formed using a heat sensitive substrate that cannot otherwise withstand the high temperatures associated with post ion implantation annealing (e.g., temperatures greater than 300° C.). Thus in an aspect, substrates 114 and 214 include a material that is chemically and/or structurally deformed at temperatures greater than about 300° C. In another aspect, substrates 114 and 214 include a material that is chemically and/or structurally deformed at temperatures greater than about 200° C. In yet another aspect, substrates 114 and 214 include a material that is chemically and/or structurally deformed at temperatures greater than about 150° C. Still in yet another aspect, substrates 114 and 214 include a material that is chemically and/or structurally deformed at temperatures greater than about 75° C. In an exemplary embodiment, substrates 114 and 214 include a flexible material, such as paper or a thin plastic. For example, suitable flexible materials for formation of the substrates 114 and 214 can include but are not limited to: paper, plastic, polyimide, polyester, polyethylene naphthalate and polyethylene terephthalate.

The material of the bottom gate electrode 112 and/or top gate electrode 212 can include a conducting material, such as a metal (e.g., molybdenum or titanium). In an exemplary embodiment, the bottom gate electrode and the top gate electrode include indium-tin oxide (ITO). The material of the gate insulator layers 110 and 210 respectively can vary. In an aspect, the gate insulating material includes thermal oxide. In another aspect, the gate insulator layers 110 and 210 include a GI layer 208 includes a gas permeable material (e.g., silicon oxide or silicon dioxide ($SiO_2$)).

In an aspect, the gate insulator layers 110 and 210 respectively have a thickness of about 1 nm to about 1000 nm. In another aspect, the gate insulator layers 110 and 210 respectively a thickness of about 10 nm to about 500 nm. In another aspect, the gate insulator layers 110 and 210 respectively a thickness of about 50 nm to about 300 nm. In another aspect, the gate insulator layers 110 and 210 respectively a thickness of about 100 nm to about 200 nm.

In an aspect, the thickness of the active metal oxide layers 108 and 208 respectively ranges from about 10 nm to about 1000 nm. In another aspect, the thickness of the active metal oxide layers 108 and 208 respectively ranges from about 50 nm to about 500 nm. In yet another aspect, the thickness of the active metal oxide layers 108 and 208 respectively ranges from about 100 nm to about 200 nm. In an aspect, the thickness of the bottom gate 112 and/or top gate 212 respectively ranges from about 10 nm to about 1000 nm. In another aspect, the thickness of the bottom gate 112 and/or top gate 212 respectively ranges from about 50 nm to about 500 nm. In yet another aspect, the thickness of the bottom gate 112 and/or top gate 212 respectively ranges from about 100 nm to about 200 nm.

FIGS. 5-9 depict an example process for fabricating a bottom gate TFT device (e.g., TFT device 100) that includes a metal oxide active layer with S/D regions having a reduced resistivity relative to the metal oxide based on doping of the S/D regions at room temperature, in accordance with aspects and embodiments described herein. Repetitive description of like elements employed in respective embodiments of TFT devices and techniques for fabricating the TFTs devices described herein is omitted for sake of brevity.

Figure 5:
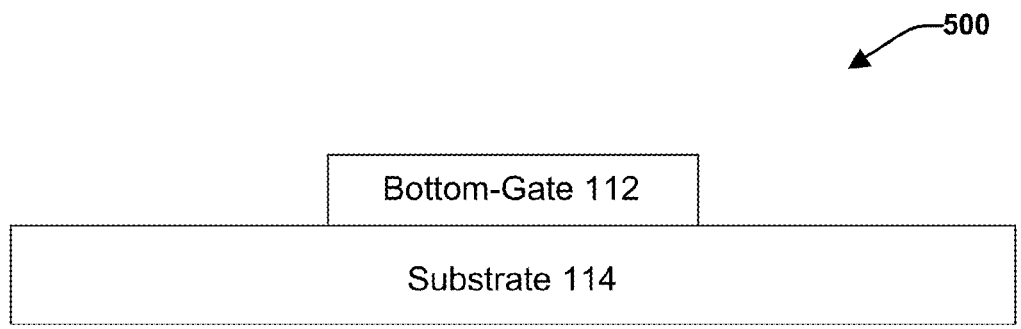
FIGS. 5-9 depict an example process for fabricating a bottom gate TFT that includes a metal oxide active layer with S/D regions having a reduced resistivity relative to the metal oxide based on doping of the S/D regions without thermal annealing, in accordance with aspects and embodiments described herein.
Figure 6:
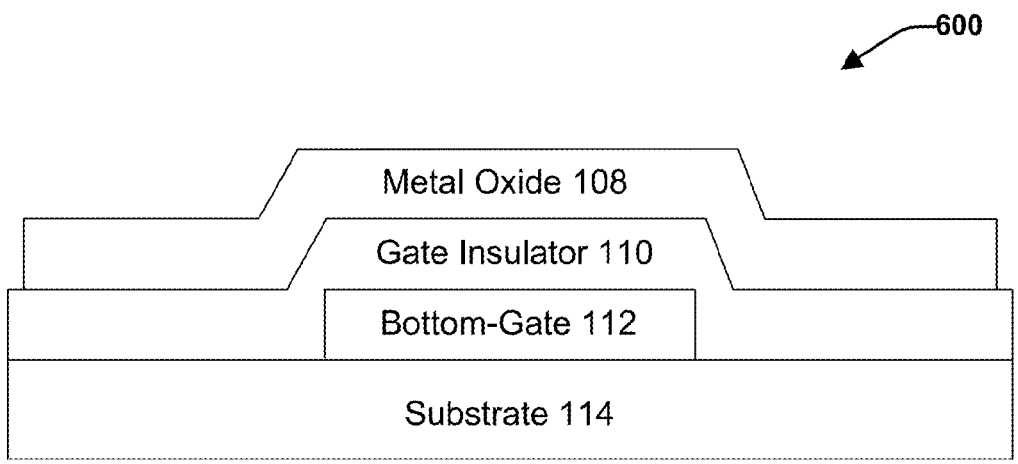
Figure 7:
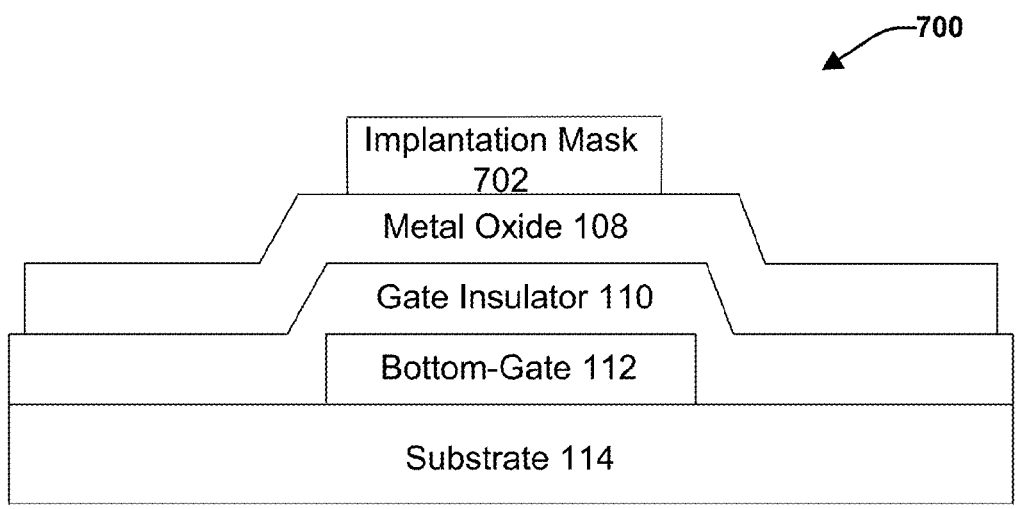
Figure 8:
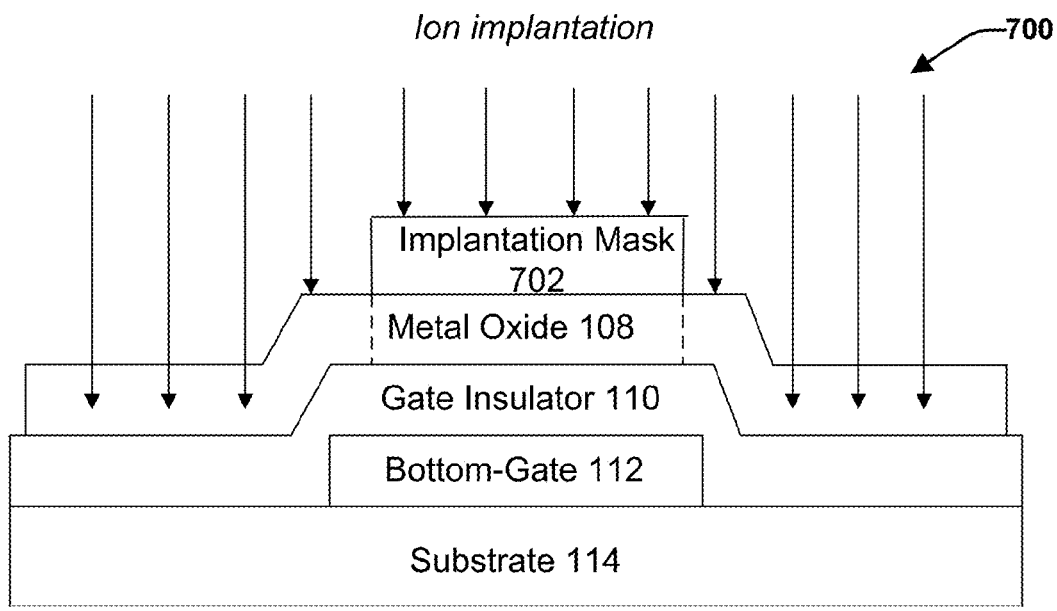

FIG. 5 depicts an intermediate transistor structure 500 following deposition of the bottom electrode 112 onto the substrate 114 and patterning of the bottom gate electrode 112. FIG. 6 depicts an intermediate transistor structure 600 resulting from deposition of the gate insulator layer 110 over the bottom gate electrode 112 and subsequent deposition of the active metal oxide layer 108 over the gate insulator layer 110. Thereafter, an implantation mask 702 is deposited over the active metal oxide layer 108 and patterned to reveal portions of the metal oxide layer 108 corresponding to the S/D regions. The resulting intermediate transistor structure 700 is depicted in FIG. 8. As seen in structure 700, a middle portion of the active metal oxide layer 108 corresponding to the channel region is covered by the implantation mask 702. In an aspect, the implantation mask 702 is deposited via plasma-enhanced chemical vapor deposition (PECVD).

Figure 9:
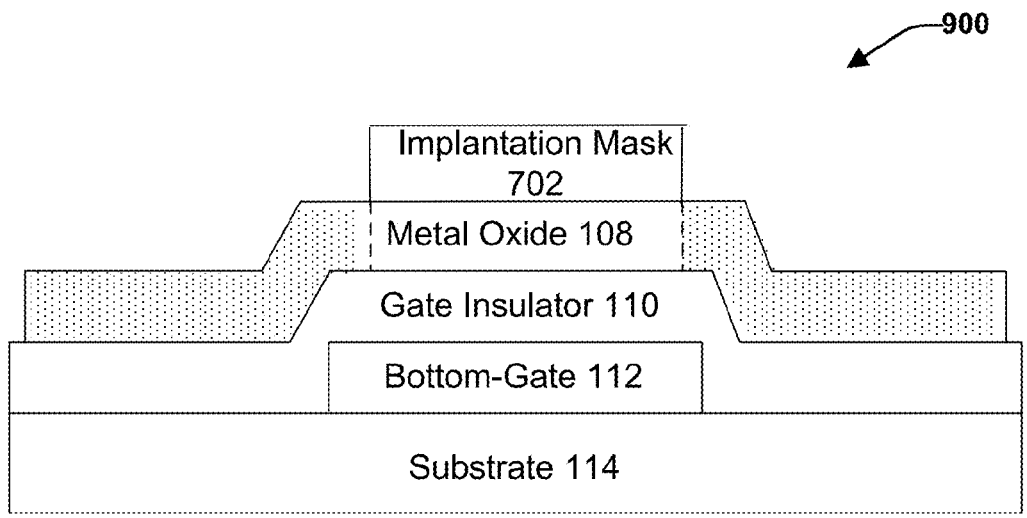

Structure 700 is then doped at room temperature as depicted in FIG. 8. In an aspect, structure 700 is doped with silicon or phosphorus ions at a concentration of about $10^{21}$ $cm^{-3}$. The resulting transistor structure 900 is depicted in FIG. 9. After doping is complete, the S/D regions, (indicated by the dotted patterned area of the metal oxide layer 108 of structure 900), have a reduced resistivity relative to the channel region of the metal oxide layer. For example, when the metal oxide layer includes ZnO, the resistivity of the doped S/D regions is about 10 mΩ·cm as a result of doping at room temperature with phosphorous or silicon ions at a concentration of about $10^{21} cm^{-3}$.

FIGS. 10-14 depict an example process for fabricating a top gate TFT device (e.g., TFT device 200) that includes a metal oxide active layer with S/D regions having a reduced resistivity relative to the metal oxide based on doping of the S/D regions at room temperature, in accordance with aspects and embodiments described herein. Repetitive description of like elements employed in respective embodiments of TFT devices and techniques for fabricating the TFTs devices described herein is omitted for sake of brevity.

Figure 10:
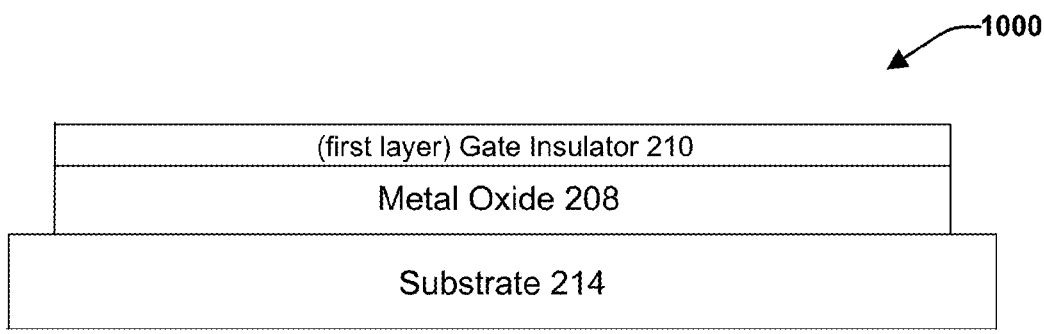
FIGS. 10-14 depict an example process for fabricating a top gate TFT that includes a metal oxide active layer with S/D regions having a reduced resistivity relative to the metal oxide based on doping of the S/D regions without thermal annealing, in accordance with aspects and embodiments described herein.
Figure 11:
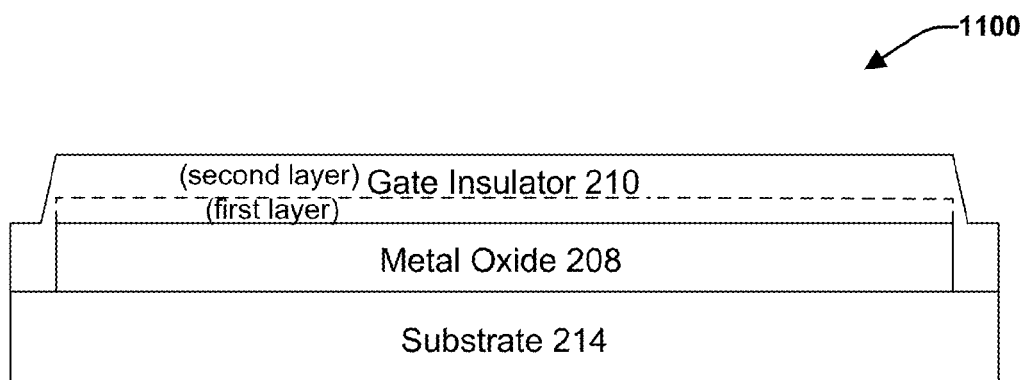

FIG. 10 depicts an intermediate transistor structure 1000 following deposition of the active metal oxide layer 208 onto the substrate 214 and subsequent deposition of a first layer of gate insulator 210 onto the active metal oxide layer 208. In an aspect, the metal oxide layer includes ZnO that was deposited using room temperature sputter deposition. For example, the ZnO layer can include about 100 nm of ZnO. In another aspect, the first gate insulator layer 210 include 50 nm of SiO deposited using PECVD. Following the patterning and etching of the active islands, a second layer of gate insulator 210 is deposited onto the first layer of gate insulator, as shown in FIG. 11. For example, an additional 50 nm of SiO can be deposited to complete the formation of the gate oxide. The resulting intermediate structure 1100 is depicted in FIG. 11.

Figure 12:
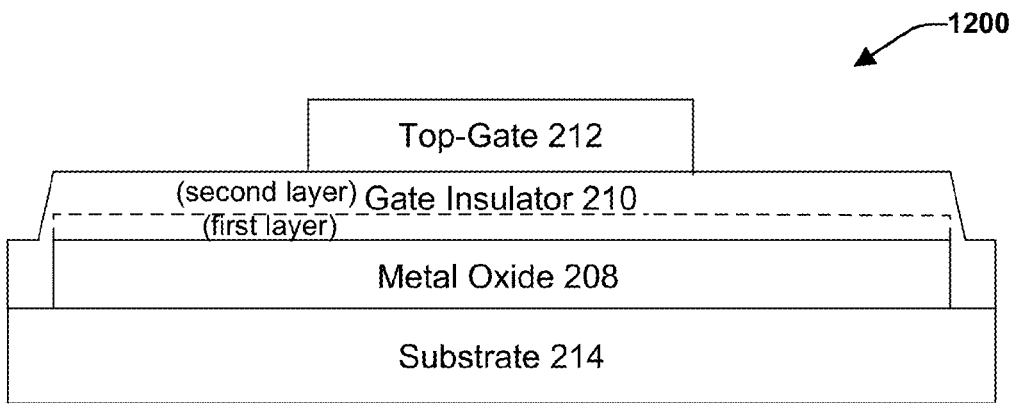
Figure 13:
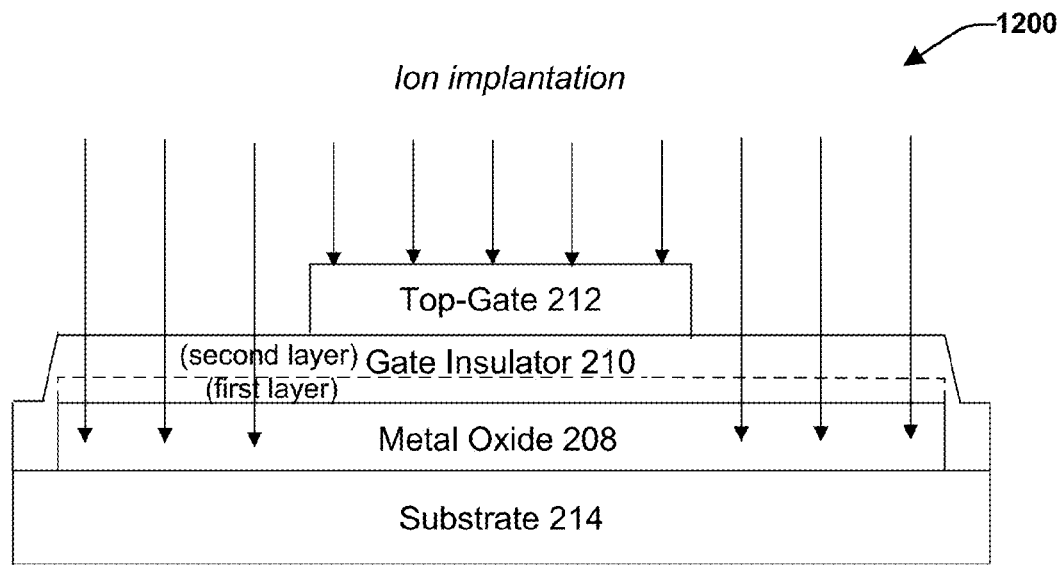

The top gate electrode 212 is then deposited onto the gate insulator layer 210 as shown in FIG. 12 to form intermediate structure 1200. For example, the top gate electrode 212 can include about 200 nm of a conducting material, such as gas-permeable ITO, sputtered at room temperature. With the top gate electrode masking the channel region, structure 1200 is then doped at room temperature as depicted in FIG. 13 to form self-aligned S/D regions (indicated by the dotted patterned area of the metal oxide layer 108 of structure 1400).

Figure 14:
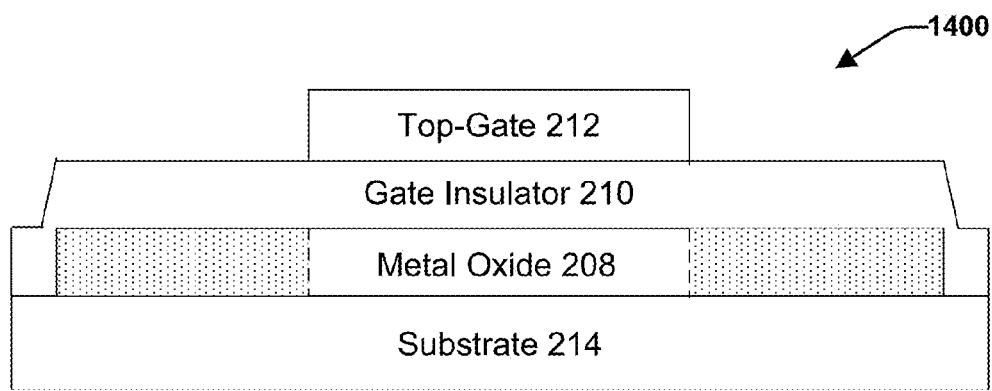

In an aspect, structure 1200 is doped with silicon or phosphorus ions at a concentration of about $10^{21}cm^{-3}$. The resulting transistor structure 1400 is depicted in FIG. 14. After doping is complete, the S/D regions, (indicated by the dotted patterned area of the metal oxide layer 108 of structure 1400), have a reduced resistivity relative to the non-doped channel region of the metal oxide layer. For example, when the metal oxide layer includes ZnO, the resistivity of the doped S/D regions is about 10 mΩ·cm as a result of doping at room temperature with phosphorous or silicon ions at a concentration of about $10^{21}$ cm$^{-3}$, even without any subsequent activation heat-treatment.

Figure 15:
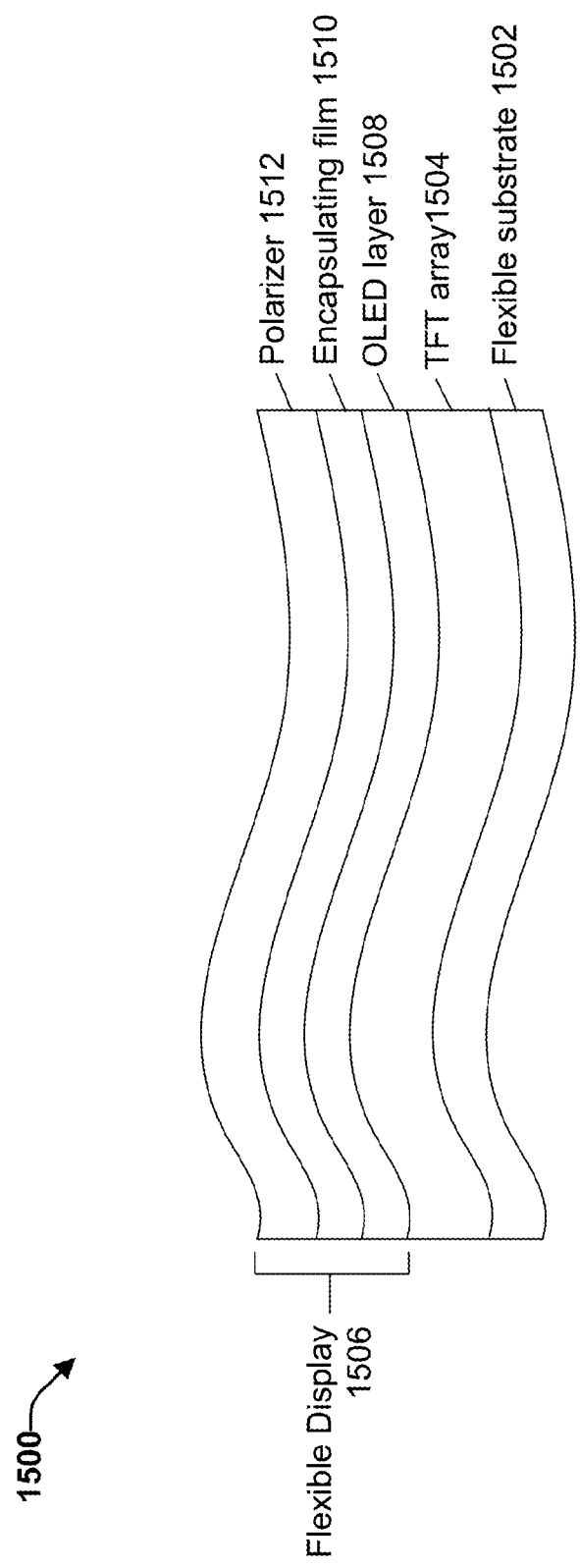
FIG. 15 provides an example flexible display device that includes a flexible TFT in accordance with aspects and embodiments described herein.

FIG. 15 provides an example flexible display device that includes a flexible TFT in accordance with aspects and embodiments described herein. Repetitive description of like elements employed in respective embodiments of TFT devices described herein is omitted for sake of brevity.

Flexible display devices have been difficult to achieve due to limitations in TFT manufacturing on non-glass substrates. Using a flexible TFT allows for a lighter display module and a more rugged display solution. Plastic or paper, based TFTs allow the end product to be substantially lighter and thinner than products using glass-based TFTs. In addition, glass-based TFTs can be fragile. The use of plastic or paper based TFTs can result in a more rugged end product with less breakage in the electronics due to drops or stress tension. The weight savings with plastic or paper substrate TFTs can make a significant difference in the end products' specs: a 10.7" LCD-based display weighs an average of 1.44 pounds while a similarly sized flexible display with a plastic or paper TFT and similar internal components can weigh only 17 ounces.

Device 1500 includes a TFT array 1504 formed on a flexible substrate 1502, such as paper or plastic. The TFT array 1504 and substrate 1502 embody one or more of the features of the TFT devices described herein, (e.g., device 100 and 200). In particular, the TFT array 1504 can include the TFTs described herein with S/D regions formed within a doped active layer having resulted from doping of an active layer comprising metal-oxide and formed on the flexible substrate with stable ions at the concentrations described herein and at room temperature and without thermal annealing. Device 1500 further includes a flexible display 1506. The TFT array 1504 is configured to facilitate operation (e.g., provide power and/or switching function) of the flexible display 1506. In an aspect, the flexible display 1506 includes an organic light emitting diode layer 1508, a flexible encapsulating film 1510 and a polarizer 1512.

Figure 16:
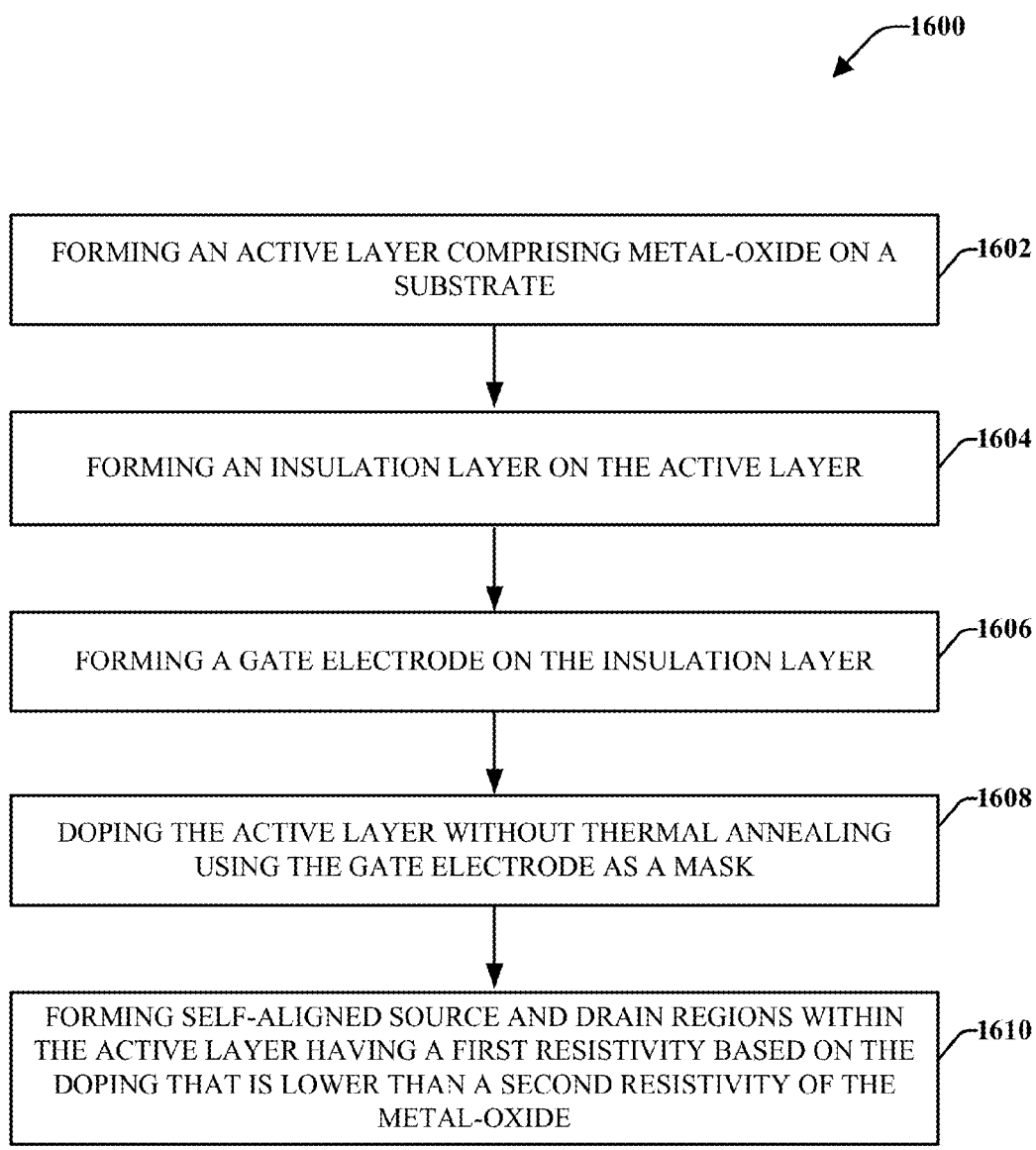
FIG. 16 provides a flow diagram of an example method for forming TFT that includes a metal oxide active layer with S/D regions having a reduced resistivity relative to the metal oxide based on doping of the S/D regions without thermal annealing, in accordance with aspects and embodiments described herein.
Figure 17:
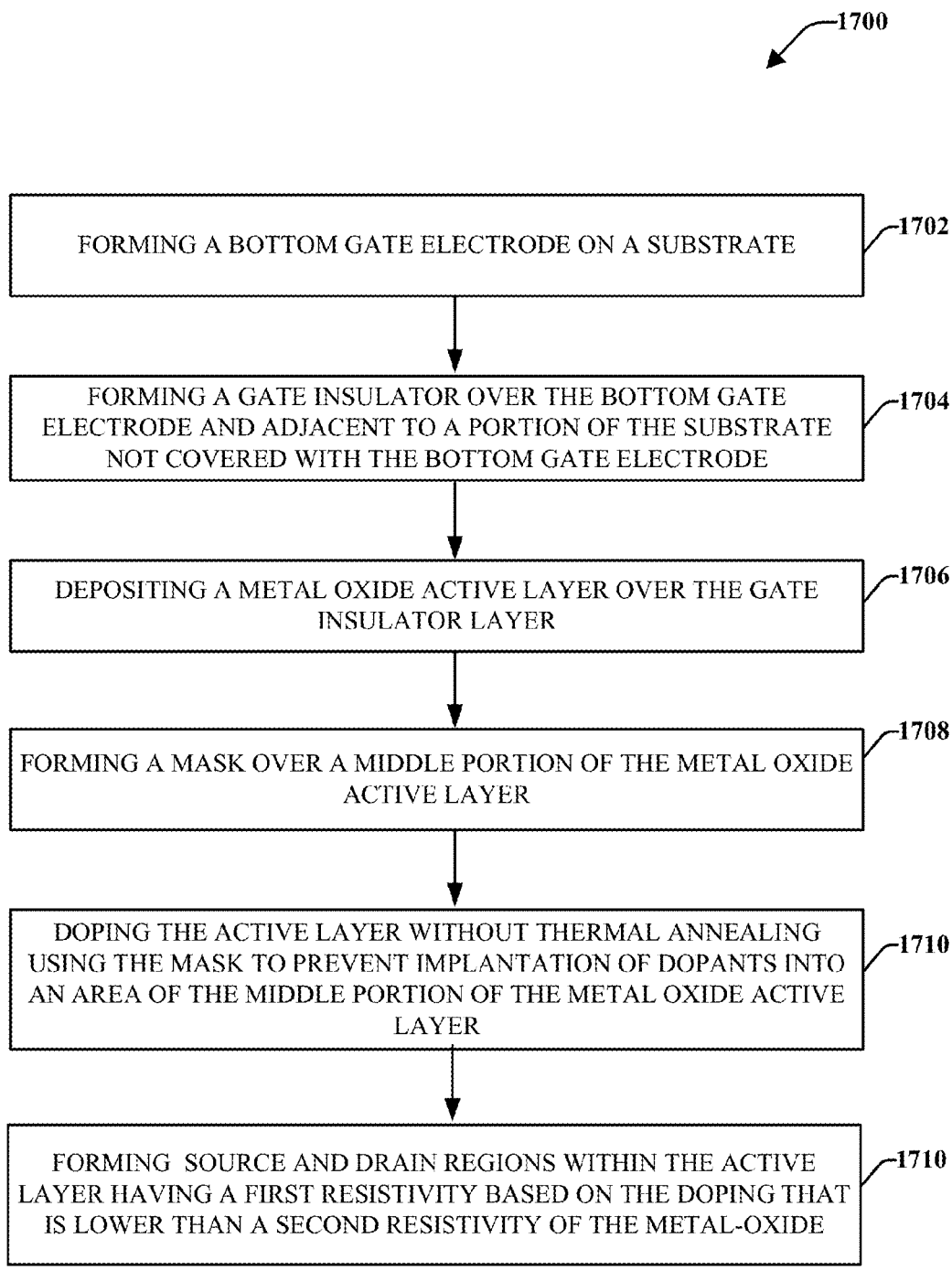
FIG. 17 provides a flow diagram of another example method for forming TFT that includes a metal oxide active layer with S/D regions having a reduced resistivity relative to the metal oxide based on doping of the S/D regions without thermal annealing, in accordance with aspects and embodiments described herein.

FIGS. 16-17 illustrate methods in accordance with certain aspects of this disclosure. While, for purposes of simplicity of explanation, the methods are shown and described as a series of acts, it is to be understood and appreciated that this disclosure is not limited by the order of acts, as some acts may occur in different orders and/or concurrently with other acts from that shown and described herein. For example, those skilled in the art will understand and appreciate that methods can alternatively be represented as a series of interrelated states or events, such as in a state diagram. Moreover, not all illustrated acts may be required to implement methods in accordance with certain aspects of this disclosure. Additionally, it is to be further appreciated that the method disclosed hereinafter and throughout this disclosure is capable of being stored on an article of manufacture to facilitate transporting and transferring such methods to computers.

Turning now to FIG. 16, presented is a high level flow diagram of an example method for forming TFT that includes a metal oxide active layer with S/D regions having a reduced resistivity relative to the metal oxide based on doping of the S/D regions at room temperature and without thermal annealing, in accordance with aspects and embodiments described herein. At 1602, an active layer comprising metal-oxide is formed on a substrate. In an exemplary embodiment, the substrate includes a high heat sensitive material (e.g., cannot withstand temperatures greater than 300° C.) and the active layer includes ZnO or IGZN. At 1604, an insulation layer is then formed on the active layer. At 1606, a gate electrode (e.g., formed with ITO) is formed and patterned on the insulation layer. At 1608, the active layer is then doped without thermal annealing (at a temperature below 300° C., preferably at room temperature using the gate electrode as a mask. At 1610, self-aligned source and drain regions are then formed within the active layer having a first resistivity based on the doping that is lower than a second resistivity of the metal-oxide. At 1612, a portion of the insulation layer formed on and adjacent to the source and drain regions via etching.

FIG. 17 presents a high level flow diagram of another example method for forming TFT that includes a metal oxide active layer with S/D regions having a reduced resistivity relative to the metal oxide based on doping of the S/D regions at room temperature and without thermal annealing, in accordance with aspects and embodiments described herein. At 1702, a bottom gate electrode is formed on a substrate. In an exemplary embodiment, the substrate includes a high heat sensitive material (e.g., cannot withstand temperatures greater than 300° C.). At 1704, a gate insulator layer is formed over the bottom gate electrode and adjacent to a portion of the substrate not covered with the bottom gate. At 1706, an metal oxide active layer is deposited over the gate insulator layer. At 1708, the active layer is doped without thermal annealing and at room temperature (such as but not limited to a temperature between about 20° C. and 26° C.) using the mask to prevent implantation of dopants into an area of the middle portion of the metal oxide active layer. At 1710, source and drain regions are formed within the metal oxide active layer having a first resistivity based on the doping that is lower than a second resistivity of the metal-oxide.

What has been described above includes examples of the subject invention. It is, of course, not possible to describe every conceivable combination of components or methods for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" and "involves" are used in either the detailed description or the claims, such terms are intended to be inclusive in a manner similar to the term "comprising" as "comprising" is interpreted when employed as a transitional word in a claim.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

The word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

What is claimed is:

1. A transistor structure, comprising:
    a substrate;
    an active layer comprising metal-oxide that is formed on the substrate;
    a gate electrode formed on a portion of the active layer;
    a source region and a drain region formed within the active layer, wherein the source region and the drain region respectively comprise implanted ions at a concentration greater than $10^{22}$ cm$^{-3}$, and wherein the implanted ions are not thermally activated; and
    a channel region formed within the active layer between the source region and the drain region, and wherein the source region and the drain region respectively contact side surfaces of the channel region,
        wherein a first resistivity of the source region and the drain region is lower than a second resistivity of the channel region based on the implanted ions at the concentration greater than $10^{22}$ cm$^{-3}$ and without the implanted ions being thermally activated.

2. The transistor structure of claim 1, wherein the first resistivity is between about $10^{0}$ Ω·cm and $10^{-2}$ Ω·cm based on the implanted ions at the concentration greater than $10^{22}$ cm$^{-3}$ and without the implanted ions being thermally activated.

3. The transistor structure of claim 1, wherein the substrate comprises a material that is structurally or chemically deformed when subjected to temperatures greater than about 200° C. and wherein the substrate is not structurally or chemically deformed.

4. The transistor structure of claim 1, wherein the substrate comprises a flexible material.

5. The transistor structure of claim 1, wherein the substrate comprises paper, plastic, polyimide, polyester, polyethylene naphthalate or polyethylene terephthalate and wherein the substrate is not structurally or chemically deformed.

6. The transistor structure of claim 1, wherein the ions comprise at least one of phosphorus ions or silicon ions.

7. The transistor structure of claim 1, wherein the ions comprise at least one of arsenic or boron ions.

8. The transistor structure of claim 1, wherein the metal-oxide includes at least one of: zinc oxide, zinc oxynitride, indium-zinc oxide, indium-gallium-zinc oxide, zinc-tin oxide, tin oxide, indium oxide, copper oxide, uranium oxide, bismuth oxide, barium titanate, strontium titanate, or lithium niobate.

9. The transistor structure of claim 1, wherein homojunctions are formed between the source region, the drain region, and the channel region.

10. The transistor structure of claim 9, wherein a length of the channel region between the source region and the drain region is less than or equal to about 100 nm.

11. The transistor structure of claim 1, wherein interfaces between the channel region, the source region and the drain region are self-aligned to edges of the gate electrode, and wherein the channel region does not comprise laterally thermally diffused ions.

12. The transistor structure of claim 1, wherein the first resistivity is about 6 orders less than the second resistivity based on the implanted ions at the concentration greater than $10^{22}$ cm$^{-3}$ and without the implanted ions being thermally activated.

13. A device, comprising:
    a flexible display; and
    a transistor configured to facilitate operation of the flexible display, the transistor comprising:
        a substrate comprising a material that is structurally or chemically deformed when subjected to temperatures greater than about 200° C., wherein the substrate is not structurally or chemically deformed;
        an active layer comprising metal oxide and formed on the substrate;
        a gate electrode formed on a portion of the active layer;
        a source region and a drain region formed within the active layer, wherein the source region and the drain region respectively comprise un-annealed ions implanted therein at a concentration greater than $10^{22}$ cm$^{-3}$,
        a channel region formed within the active layer between the source region and the drain region, and wherein the source region and the drain region respectively contact side surfaces of the channel region,
            wherein homojunctions are formed between the source region, the drain region, and the channel region, and
            wherein source region and the drain region respectively exhibit a resistivity between about $10^{0}$ Ω·cm and $10^{-2}$ Ω·cm based on the un-annealed ions implanted therein at the concentration greater than $10^{22}$ cm$^{-3}$.

14. The device of claim 13, wherein the substrate comprises paper, plastic, polyimide, polyester, polyethylene naphthalate or polyethylene terephthalate.

15. The device of claim 13, wherein the ions comprise at least one of: phosphorus ions, silicon ions, arsenic ions or boron ions.

16. The device of claim 13, wherein the metal-oxide includes at least one of: zinc oxide, zinc oxynitride, indium-zinc oxide, indium-gallium-zinc oxide, zinc-tin oxide, tin oxide, indium oxide, copper oxide, uranium oxide, bismuth oxide, barium titanate, strontium titanate, or lithium niobate.

17. The device of claim 13, wherein interfaces between the channel region, the source region and the drain region are self-aligned to edges of the gate electrode, and wherein the channel region does not comprise any of the dopants.

18. A transistor structure, comprising:
a substrate comprising a material that is structurally or chemically deformed when subjected to temperatures greater than about 200° C., wherein the substrate is not structurally or chemically deformed;
an active layer comprising metal-oxide and formed on the substrate;
a gate electrode formed on a portion of the active layer;
a source region and a drain region formed within the active layer and respectively comprising un-annealed dopants implanted therein at a concentration greater than $10^{22} cm^{-3}$; and
a channel region formed within the active layer between the source region and the drain region, wherein the channel regions does not comprise laterally thermally diffused dopants, and wherein the source region and the drain region respectively contact side surfaces of the channel region, and
wherein the source region and the drain region exhibit respective resistivities between about $10^0 \Omega \cdot cm$ and $10^{-2} \Omega \cdot cm$ based on the un-annealed dopants being implanted therein at the concentration greater than $10^{22} cm^{-3}$.

19. The transistor structure of claim 18, wherein interfaces between the channel region, the source region and the drain region are self-aligned to edges of the gate electrode.

20. The transistor structure of claim 18, wherein the source region and the drain region respectively exhibit a resistivity of less than or equal to about 10.0 m$\Omega \cdot$cm based on the un-annealed dopants being implanted therein at the concentration greater than $10^{22} cm^{-3}$.

* * * * *